(12) United States Patent
Oie et al.

(10) Patent No.: US 10,629,426 B2
(45) Date of Patent: Apr. 21, 2020

(54) SEMICONDUCTOR ELEMENT CLEANING SOLUTION THAT SUPPRESSES DAMAGE TO COBALT, AND METHOD FOR CLEANING SEMICONDUCTOR ELEMENT USING SAME

(71) Applicant: MITSUBISHI GAS CHEMICAL COMPANY, INC., Chiyoda-ku (JP)

(72) Inventors: Toshiyuki Oie, Tokyo (JP); Kenji Shimada, Tokyo (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 0 days.

(21) Appl. No.: 15/514,917

(22) PCT Filed: Oct. 2, 2015

(86) PCT No.: PCT/JP2015/078077
§ 371 (c)(1),
(2) Date: Mar. 28, 2017

(87) PCT Pub. No.: WO2016/076033
PCT Pub. Date: May 19, 2016

(65) Prior Publication Data
US 2017/0240850 A1    Aug. 24, 2017

(30) Foreign Application Priority Data
Nov. 13, 2014    (JP) .................. 2014-230636

(51) Int. Cl.
*H01L 21/02*    (2006.01)
*C11D 7/10*    (2006.01)
(Continued)

(52) U.S. Cl.
CPC .......... *H01L 21/02041* (2013.01); *C11D 7/04* (2013.01); *C11D 7/06* (2013.01);
(Continued)

(58) Field of Classification Search
None
See application file for complete search history.

(56) References Cited

U.S. PATENT DOCUMENTS

| 3,692,685 A * | 9/1972 | Lamberti .............. C07C 59/305 210/698 |
| 2004/0122112 A1* | 6/2004 | Griese ...................... C11D 3/28 516/43 |

(Continued)

FOREIGN PATENT DOCUMENTS

| EP | 0 560 083 A1 | 9/1993 |
| JP | 6-81177 A | 3/1994 |

(Continued)

OTHER PUBLICATIONS

PCT Written Opinion of the International Search Authority dated Nov. 17, 2015.*

(Continued)

*Primary Examiner* — Jiong-Ping Lu
(74) *Attorney, Agent, or Firm* — Oblon, McClelland, Maier & Neustadt, L.L.P.

(57) ABSTRACT

According to the present invention, it is possible to provide a cleaning solution which removes a dry etching residue on a surface of a semiconductor element that includes: (1) a material containing cobalt or a cobalt alloy or (2) a material containing cobalt or a cobalt alloy and tungsten; and a low-dielectric constant interlayer dielectric film. The cleaning solution contains 0.001-7 mass % of an alkali metal compound, 0.005-35 mass % of a peroxide, 0.005-10 mass % of an anti-corrosion agent, 0.000001-1 mass % of an alkaline earth metal compound, and water.

17 Claims, 1 Drawing Sheet

(51) Int. Cl.
*C11D 7/32* (2006.01)
*C11D 7/12* (2006.01)
*C11D 7/06* (2006.01)
*H01L 21/311* (2006.01)
*C11D 7/04* (2006.01)
*C11D 7/08* (2006.01)
*C11D 11/00* (2006.01)
*H01L 21/306* (2006.01)
*H01L 21/308* (2006.01)

(52) U.S. Cl.
CPC .................. *C11D 7/08* (2013.01); *C11D 7/10* (2013.01); *C11D 7/105* (2013.01); *C11D 7/12* (2013.01); *C11D 7/32* (2013.01); *C11D 7/3209* (2013.01); *C11D 7/3218* (2013.01); *C11D 7/3281* (2013.01); *C11D 11/0047* (2013.01); *H01L 21/0206* (2013.01); *H01L 21/02063* (2013.01); *H01L 21/308* (2013.01); *H01L 21/30604* (2013.01); *H01L 21/31133* (2013.01)

(56) References Cited

U.S. PATENT DOCUMENTS

| | | | | |
|---|---|---|---|---|
| 2004/0226638 | A1* | 11/2004 | Posson | C06B 21/0025 149/45 |
| 2009/0082240 | A1 | 3/2009 | Nukui et al. | |
| 2009/0165818 | A1* | 7/2009 | Smith | C11D 3/046 134/7 |
| 2010/0221503 | A1* | 9/2010 | Pollard | C11D 7/3209 428/195.1 |
| 2012/0311923 | A1* | 12/2012 | Rawat | C10L 1/14 44/308 |
| 2013/0102515 | A1* | 4/2013 | Hueffer | C11D 3/0073 510/219 |
| 2013/0296214 | A1 | 11/2013 | Barnes et al. | |
| 2015/0027978 | A1* | 1/2015 | Barnes | C09K 13/00 216/13 |
| 2016/0130500 | A1* | 5/2016 | Chen | C11D 3/30 216/13 |

FOREIGN PATENT DOCUMENTS

| | | |
|---|---|---|
| JP | 2001-26890 A | 1/2001 |
| JP | 2002-198346 A | 7/2002 |
| JP | 2003-316028 A | 11/2003 |
| JP | 2004-212818 A | 7/2004 |
| JP | 2008-285508 A | 11/2008 |
| JP | 2009-69505 A | 4/2009 |
| JP | 2009-75285 A | 4/2009 |
| JP | 2009-231354 A | 10/2009 |
| JP | 2011-91248 A | 5/2011 |
| JP | 2012-182158 A | 9/2012 |
| JP | 2013-533631 A | 8/2013 |
| TW | 1317354 B | 11/2009 |

OTHER PUBLICATIONS

International Search Report dated Nov. 17, 2015, in PCT/JP2015/078077, filed Oct. 2, 2015.

* cited by examiner

[Figure 1]
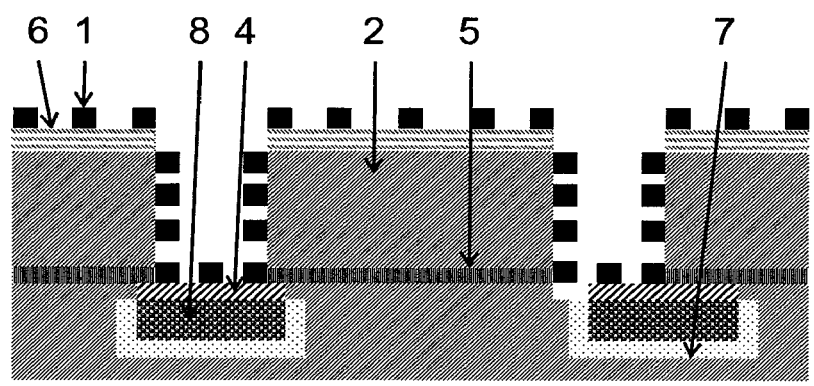
[Figure 2]
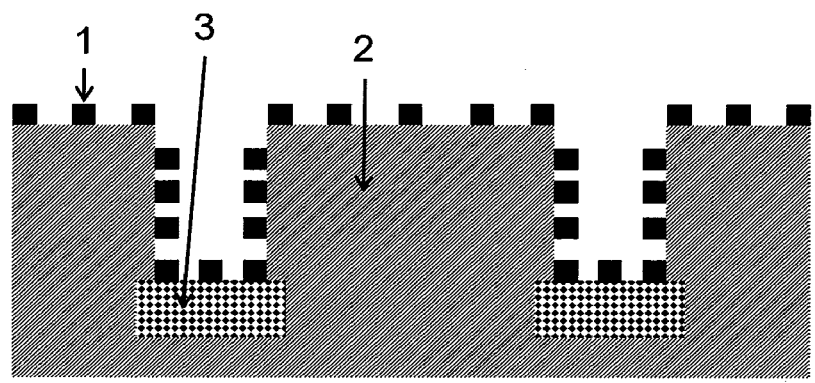

US 10,629,426 B2

SEMICONDUCTOR ELEMENT CLEANING SOLUTION THAT SUPPRESSES DAMAGE TO COBALT, AND METHOD FOR CLEANING SEMICONDUCTOR ELEMENT USING SAME

TECHNICAL FIELD

The present invention relates to a cleaning solution, which suppresses damage to at least a low-dielectric constant interlayer dielectric film and (1) a material containing cobalt or a cobalt alloy or (2) a material containing cobalt or a cobalt alloy and tungsten and removes a dry etching residue present on a surface of a semiconductor element in the process for manufacturing the semiconductor element, and a method for cleaning a semiconductor element using the same.

BACKGROUND ART

The production of a highly integrated semiconductor element generally has a series of processes as follows: a conductive thin film such as a metal film as a conductive wiring material and an interlayer dielectric film for insulation between conductive thin films are formed on an element such as a silicon wafer; after that, a photoresist is uniformly applied to the surface thereof to provide a photosensitive layer, and this is subjected to the selective exposure/development treatment to form a desired resist pattern; then the dry etching treatment is applied to the interlayer dielectric film using the resist pattern as a mask to form a desired pattern on the thin film; and then the resist pattern, residue generated by the dry etching treatment (hereinafter referred to as "dry etching residue"), etc. are completely removed by ashing with oxygen plasma, and then cleaning with a cleaning solution or the like.

Recently, the miniaturization of design rules has been accelerated, and the limit of high-speed arithmetic processing has been gradually controlled by signal transmission delay. For this reason, the conductive wiring material has been changed from aluminium to copper which has lower electrical resistance, and the interlayer dielectric film has been changed from a silicone oxide film to a low dielectric constant film (a film having a dielectric constant of less than 3, hereinafter referred to as "low-k film"). However, with the miniaturization of wiring, electromigration of copper easily occurs due to increase in the density of current flowing through the wiring. In response to this, a technique of using cobalt as a highly-reliable wiring material instead of copper and a technique of introducing a cobalt alloy as a cap metal for preventing electromigration of copper have been reported. Further, patterns of 0.2 μm or less have problems in which, for example, the aspect ratio of a pattern of a resist having a film thickness of 1 μm (the ratio obtained by dividing the film thickness of the resist by the line width of the resist) is too large, resulting in collapse of the pattern. In order to solve this, sometimes used is the hard mask method in which: a film containing titanium or silicon (hereinafter referred to as "the hard mask") is inserted between a pattern film on which a pattern is desired to be actually formed and a resist film; a resist pattern is transferred to the hard mask by dry etching; and after that, this hard mask is used as an etching mask to transfer the pattern to the film on which the pattern is desired to be actually formed by dry etching. In this method, a gas to be used for etching the film on which the pattern is desired to be actually formed may be changed from a gas to be used for etching the hard mask. It is possible to select a gas which can secure a selection ratio with the resist when etching the hard mask and to select a gas which can secure a selection ratio with the hard mask when etching the actual film. For this reason, there is an advantage that a pattern can be formed with a thin resist. Further, a tungsten-containing material is used for a contact plug for connection to a substrate.

When a dry etching residue is removed with oxygen plasma, there is a problem that a low-k film, cobalt and a cobalt alloy, a barrier metal and a barrier insulating film are damaged due to exposure to oxygen plasma or the like, resulting in significant deterioration of electrical characteristics. For this reason, in the production of a semiconductor element using a low-k film, it is desired to employ a method of suppressing damage to a low-k film, cobalt and a cobalt alloy, a barrier metal and a barrier insulating film while removing a dry etching residue at a level comparable to that of an oxygen plasma process. Moreover, for use also for a layer on which a contact plug is exposed, it is sometimes required to suppress damage to a tungsten-containing material. Furthermore, when using a hard mask, it is also required to suppress damage to a material including the hard mask.

Patent Document 1 proposes a method for preventing corrosion of cobalt using benzotriazole, etc. However, when using this method, damage to cobalt cannot be suppressed at a satisfactory level (see Comparative Examples 6 and 9).

Patent Document 2 proposes a method for preventing corrosion of cobalt using a combination of 5-amino-1H-tetrazole and 1-hydroxybenzotriazole. However, when using this method, damage to cobalt cannot be suppressed at a satisfactory level (see Comparative Examples 7 and 10).

Patent Document 3 proposes a method for preventing corrosion of cobalt by forming a corrosion prevention film on cobalt using copper (II) ion, benzotriazole, etc. However, when using this method, damage to cobalt cannot be suppressed at a satisfactory level (see Comparative Examples 8 and 11).

Patent Document 4 proposes a method for preventing corrosion of tungsten using 4-amino-1,2,4-triazole and polyethyleneimine. However, when using this method, damage to a tungsten-containing material cannot be suppressed at a satisfactory level (see Comparative Examples 6, 7 and 8).

Patent Document 5 proposes a method for preventing corrosion of tungsten using a quaternary ammonium salt, pyridinium, bipyridinium and an imidazolium salt. However, when using this method, damage to a tungsten-containing material cannot be suppressed at a satisfactory level (see Comparative Examples 9, 10 and 11).

Patent Document 6 proposes a wiring forming method using a cleaning solution containing phosphoric acid, hydrochloric acid, primary to quaternary amines, an amino acid type surfactant and water. However, when using this cleaning solution, residue cannot be removed at a satisfactory level, and damage to cobalt cannot be suppressed at a satisfactory level. Therefore, this cleaning solution cannot be used for the above-described purpose (see Comparative Example 12).

Patent Document 7 proposes a wiring forming method using a cleaning solution containing an oxidant, quaternary ammonium hydroxide, alkanolamine, alkali metal hydroxide and water. However, when using this cleaning solution, damage to a tungsten-containing material cannot be suppressed at a satisfactory level. Therefore, this cleaning solution cannot be used for the above-described purpose (see Comparative Example 13).

Patent Document 8 proposes a wiring forming method using a cleaning solution containing an oxidant, amine, quaternary ammonium hydroxide, alkali metal hydroxide, an organic solvent, a surfactant and water. However, when using this cleaning solution, damage to tungsten cannot be suppressed at a satisfactory level. Therefore, this cleaning solution cannot be used for the above-described purpose (see Comparative Example 14).

Patent Document 9 proposes a wiring forming method using a cleaning solution containing a fluorine compound, a metal corrosion inhibitor, a passivator and water. However, when using this cleaning solution, residue cannot be sufficiently removed, and damage to a low-k film cannot be suppressed at a satisfactory level. Therefore, this cleaning solution cannot be used for the above-described purpose (see Comparative Example 15).

PRIOR ART DOCUMENTS

Patent Documents

Patent Document 1: Japanese Laid-Open Patent Publication No. 2011-91248
Patent Document 2: Japanese Laid-Open Patent Publication No. 2012-182158
Patent Document 3: Japanese Laid-Open Patent Publication No. H06-81177
Patent Document 4: Japanese Laid-Open Patent Publication No. 2001-026890
Patent Document 5: Japanese Laid-Open Patent Publication No. 2008-285508
Patent Document 6: Japanese Laid-Open Patent Publication No. 2003-316028
Patent Document 7: Japanese Laid-Open Patent Publication No. 2009-75285
Patent Document 8: Japanese Laid-Open Patent Publication No. 2009-231354
Patent Document 9: Japanese Laid-Open Patent Publication No. 2013-533631

SUMMARY OF THE INVENTION

Problems to be Solved by the Invention

The purpose of the present invention is to provide a cleaning solution, which suppresses damage to at least a low-k film and a material containing cobalt or a cobalt alloy and removes a dry etching residue on the surface of a product to be treated in the process for manufacturing a semiconductor element, and a cleaning method using the same.

Another purpose of the present invention is to provide a cleaning solution, which suppresses damage to at least a low-k film and a material containing cobalt or a cobalt alloy and tungsten and removes a dry etching residue on the surface of a product to be treated in the process for manufacturing a semiconductor element, and a cleaning method using the same.

Means for Solving the Problems

The above-described problems can be solved by the present invention. Specifically, the present invention is as follows:
<1> A cleaning solution which removes a dry etching residue on a surface of a semiconductor element that includes: a low dielectric constant film (a low-k film); and (1) a material containing cobalt or a cobalt alloy or (2) a material containing cobalt or a cobalt alloy and tungsten, the cleaning solution containing 0.001 to 7% by mass of an alkali metal compound, 0.005 to 35% by mass of a peroxide, 0.005 to 10% by mass of an anticorrosive, 0.000001 to 1% by mass of an alkaline earth metal compound and water.
<2> The cleaning solution according to item <1>, wherein the alkali metal compound is at least one substance selected from the group consisting of lithium hydroxide, lithium sulfate, lithium carbonate, lithium hydrogen carbonate, lithium nitrate, lithium fluoride, lithium chloride, lithium bromide, lithium iodide, lithium acetate, sodium hydroxide, sodium sulfate, sodium carbonate, sodium hydrogen carbonate, sodium nitrate, sodium fluoride, sodium chloride, sodium bromide, sodium iodide, sodium acetate, potassium hydroxide, potassium sulfate, potassium carbonate, potassium hydrogen carbonate, potassium nitrate, potassium fluoride, potassium chloride, potassium bromide, potassium iodide, potassium acetate, cesium hydroxide, cesium sulfate, cesium carbonate, cesium hydrogen carbonate, cesium nitrate, cesium fluoride, cesium chloride, cesium bromide, cesium iodide and cesium acetate.
<3> The cleaning solution according to item <1> or <2>, wherein the peroxide is at least one substance selected from the group consisting of hydrogen peroxide, urea peroxide, m-chloroperoxybenzoic acid, tert-butyl hydroperoxide, peracetic acid, di-tert-butyl peroxide, benzoyl peroxide, acetone peroxide, methyl ethyl ketone peroxide, hexamethylene triperoxide and cumene hydroperoxide.
<4> The cleaning solution according to any one of items <1> to <3>, wherein the anticorrosive is at least one substance selected from the group consisting of a diamine compound, an alkanolamine compound, a pyrazole compound, an imidazole compound and a triazole compound.
<5> The cleaning solution according to item <4>, wherein the diamine compound is at least one substance selected from the group consisting of 1,2-propanediamine, 1,3-propanediamine and 1,4-butanediamine.
<6> The cleaning solution according to item <4>, wherein the alkanolamine compound is at least one substance selected from the group consisting of 2-aminoethanol, 2-methylaminoethanol, 1-amino-2-propanol and 1-amino-3-propanol.
<7> The cleaning solution according to item <4>, wherein the pyrazole compound is at least one substance selected from the group consisting of pyrazole and 3,5-dimethylpyrazole.
<8> The cleaning solution according to item <4>, wherein the imidazole compound is at least one substance selected from the group consisting of 1-methylimidazole, 1-vinylimidazole and 5-methylbenzimidazole.
<9> The cleaning solution according to item <4>, wherein the triazole compound is at least one substance selected from the group consisting of 1,2,4-triazole, 1,2,3-triazole and 5-methyl-1H-benzotriazole.
<10> The cleaning solution according to any one of items <1> to <9>, wherein the alkaline earth metal compound is at least one substance selected from the group consisting of a calcium compound, a strontium compound and a barium compound.
<11> A cleaning method for removing a dry etching residue on a surface of a semiconductor element by washing the semiconductor element, the semiconductor element being obtained by forming a hard mask pattern on a substrate that includes: a low dielectric constant film (a low-k film); and (1) a material containing cobalt or a cobalt alloy or (2) a material containing cobalt or a cobalt alloy and tungsten and then providing dry etching treatment to the low dielectric constant film (the low-k film) using the hard mask pattern as a mask, wherein the cleaning solution according to any one of items <1> to <10> is used.

Advantageous Effect of the Invention

By employing the cleaning solution of the present invention and the cleaning method using the same, it is possible to suppress damage to at least a low-dielectric constant interlayer dielectric film and (1) a material containing cobalt or a cobalt alloy or (2) a material containing cobalt or a cobalt alloy and tungsten and remove a dry etching residue on a surface of a product to be treated in the process for manufacturing a semiconductor element, and it is possible to produce a semiconductor element having high precision and high quality with a high yield.

BRIEF DESCRIPTION OF THE DRAWINGS

FIG. 1 is a schematic cross sectional view showing an example of a layer having a cobalt cap metal structure including a hard mask in a semiconductor element prior to removal of a dry etching residue.

FIG. 2 is a schematic cross sectional view showing an example of a layer having a tungsten-containing material in a semiconductor element prior to removal of a dry etching residue.

EMBODIMENTS FOR CARRYING OUT THE INVENTION

The cleaning solution of the present invention is used in the cleaning process in the production of a semiconductor element, and in this case, a dry etching residue can be cleaned/removed at a quite satisfactory level, and it is possible to suppress damage to at least a low-k film and (1) a material containing cobalt or a cobalt alloy or (2) a material containing cobalt or a cobalt alloy and tungsten. The cleaning solution of the present invention can be used for a semiconductor element having a material containing cobalt or a cobalt alloy, and can also be used for a semiconductor element having a material containing cobalt or a cobalt alloy and tungsten. When a material has both cobalt or a cobalt alloy and tungsten, the cobalt or the cobalt alloy and the tungsten are not required to be contained in the same layer constituting one semiconductor element, and may be respectively contained in different layers constituting one semiconductor element. According to the present invention, by using one cleaning solution, corrosion of cobalt or a cobalt alloy can be prevented in a layer containing the cobalt or the cobalt alloy, and corrosion of tungsten can be prevented in another layer containing the tungsten, and therefore it is significantly convenient. It is sufficient when (1) cobalt or a cobalt alloy or (2) cobalt or a cobalt alloy and tungsten titanium is contained in the semiconductor element to which the cleaning solution of the present invention is applied, and a metal other than these may also be contained therein.

Examples of the alkali metal compound contained in the cleaning solution of the present invention include lithium hydroxide, lithium sulfate, lithium carbonate, lithium hydrogen carbonate, lithium nitrate, lithium fluoride, lithium chloride, lithium bromide, lithium iodide, lithium acetate, sodium hydroxide, sodium sulfate, sodium carbonate, sodium hydrogen carbonate, sodium nitrate, sodium fluoride, sodium chloride, sodium bromide, sodium iodide, sodium acetate, potassium hydroxide, potassium sulfate, potassium carbonate, potassium hydrogen carbonate, potassium nitrate, potassium fluoride, potassium chloride, potassium bromide, potassium iodide, potassium acetate, cesium hydroxide, cesium sulfate, cesium carbonate, cesium hydrogen carbonate, cesium nitrate, cesium fluoride, cesium chloride, cesium bromide, cesium iodide and cesium acetate.

Among them, lithium hydroxide, lithium carbonate, sodium hydroxide, potassium hydroxide, potassium sulfate, potassium carbonate, potassium hydrogen carbonate, potassium nitrate, potassium fluoride, potassium chloride, potassium bromide, potassium iodide, potassium acetate and cesium carbonate are more preferred.

These alkali metals may be used solely, or two or more of them may be used in combination.

The concentration of the alkali metal compound contained in the cleaning solution of the present invention is 0.001 to 7% by mass, preferably 0.005 to 5% by mass, more preferably 0.01 to 4.5% by mass, and particularly preferably 0.1 to 3% by mass. When the concentration is within the above-described range, the dry etching residue can be effectively removed. When the concentration is more than 7% by mass, the low-k film may be damaged.

The peroxide contained in the cleaning solution of the present invention is a compound having a structure of (—O—O—) (O is an oxygen atom). Specific examples of the peroxide include, but are not limited to, hydrogen peroxide, urea peroxide, m-chloroperoxybenzoic acid, tert-butyl hydroperoxide, peracetic acid, di-tert-butyl peroxide, benzoyl peroxide, acetone peroxide, methyl ethyl ketone peroxide, hexamethylene triperoxide and cumene hydroperoxide. Among them, hydrogen peroxide, m-chloroperoxybenzoic acid and tert-butyl hydroperoxide are more preferred. These peroxides may be used solely, or two or more of them may be used in combination.

An inorganic peroxide reacts with water, resulting in the generation of hydrogen peroxide in the cleaning solution, and therefore the inorganic peroxide is substantially equivalent to hydrogen peroxide. For this reason, the inorganic peroxide may be added to the cleaning solution in order to generate hydrogen peroxide therein. Specific examples of the inorganic peroxide include, but are not limited to, lithium peroxide, potassium peroxide, sodium peroxide, rubidium peroxide, cesium peroxide, beryllium peroxide, magnesium peroxide, calcium peroxide, strontium peroxide, barium peroxide, zinc peroxide, cadmium peroxide and copper peroxide.

The concentration of the peroxide contained in the cleaning solution of the present invention is 0.005 to 35% by mass, preferably 0.01 to 30% by mass, more preferably 0.1 to 25% by mass, and particularly preferably 0.5 to 6% by mass. When the concentration is less than 0.005% by mass, it may be impossible to remove the dry etching residue. Meanwhile, when the concentration is more than 35% by mass, the tungsten-containing material and the hard mask may be damaged.

Examples of the anticorrosive contained in the cleaning solution of the present invention include: diamine compounds such as 1,2-propanediamine, 1,3-propanediamine and 1,4-butanediamine; alkanolamine compounds such as 2-aminoethanol, 2-methylaminoethanol, 1-amino-2-propanol and 1-amino-3-propanol; pyrazole compounds such as pyrazole and 3,5-dimethylpyrazole; imidazole compounds such as 1-methylimidazole, 1-vinylimidazole and 5-methylbenzimidazole; and triazole compounds such as 1,2,4-triazole, 1,2,3-triazole, 4-amino-1,2,4-triazole and 5-methyl-1H-benzotriazole.

Among them, 1,2-propanediamine, 1,4-butanediamine, 2-aminoethanol, 1-amino-2-propanol, pyrazole, 1-methylimidazole, 1,2,4-triazole and 5-methyl-1H-benzotriazole are more preferred.

These anticorrosives may be used solely, or two or more of them may be used in combination.

The concentration of the anticorrosive contained in the cleaning solution of the present invention is 0.005 to 10% by mass, preferably 0.008 to 8% by mass, more preferably 0.01 to 5% by mass, and particularly preferably 0.01 to 3% by mass. When the concentration is within the above-described range, damage to cobalt can be suppressed.

Examples of the alkaline earth metal compound contained in the cleaning solution of the present invention include a calcium compound, a strontium compound and a barium compound. Specific examples of the calcium compound, the strontium compound and the barium compound include, but are not limited to, calcium hydroxide, calcium sulfate, calcium sulfite, calcium carbonate, calcium hydrogen carbonate, calcium nitrate, calcium fluoride, calcium chloride, calcium bromide, calcium iodide, calcium oxide, calcium peroxide, calcium sulfide, calcium acetate, strontium hydroxide, strontium sulfate, strontium sulfite, strontium carbonate, strontium hydrogen carbonate, strontium nitrate, strontium fluoride, strontium chloride, strontium bromide, strontium iodide, strontium oxide, strontium peroxide, strontium sulfide, strontium acetate, barium hydroxide, barium sulfate, barium sulfite, barium carbonate, barium hydrogen carbonate, barium nitrate, barium fluoride, barium chloride, barium bromide, barium iodide, barium oxide, barium peroxide, barium sulfide and barium acetate.

Among them, calcium hydroxide, strontium carbonate, barium hydroxide, barium nitrate, barium sulfate, barium carbonate, barium hydrogen carbonate and barium chloride are more preferred, and barium hydroxide, barium nitrate and barium chloride are particularly preferred.

These alkaline earth metal compounds may be used solely, or two or more of them may be used in combination.

The concentration of the alkaline earth metal compound contained in the cleaning solution of the present invention is 0.000001 to 1% by mass, preferably 0.000001 to 0.5% by mass, more preferably 0.00001 to 0.1% by mass, and particularly preferably 0.00075 to 0.075% by mass. When the concentration is within the above-described range, the dry etching residue can be effectively removed. When the concentration is less than 0.000001% by mass, tungsten may be damaged.

The present inventors found for the first time that the alkaline earth metal compound contained in the cleaning solution exerts anticorrosive effects on the tungsten-containing material. The mechanism thereof has not been elucidated, but it is considered that the alkaline earth metal compound adsorbs to the surface of tungsten, thereby preventing corrosion of tungsten caused by a peroxide such as hydrogen peroxide and an alkali contained in the cleaning solution.

In the cleaning solution of the present invention, if desired, an alkali compound which is conventionally used in semiconductor cleaning solutions may be blended within a range in which the purpose of the present invention is not impaired. For example, quaternary ammonium hydroxide, ammonia, organic amine, a rubidium compound, a beryllium compound, a magnesium compound, etc. can be added. Note that the alkali that can be used is not limited thereto.

In the cleaning solution of the present invention, an additive which is conventionally used in semiconductor cleaning solutions may be blended within a range in which the purpose of the present invention is not impaired. Examples of the additive include a chelating agent, a surfactant and a defoaming agent.

The temperature at which the cleaning solution of the present invention is used is 10 to 80° C., preferably 20 to 70° C., and may be appropriately selected depending on etching conditions and a semiconductor element to be used. With the cleaning method of the present invention, ultrasonic may be used in combination according to need.

The time for use of the cleaning solution of the present invention is 0.2 to 60 minutes, and may be appropriately selected depending on etching conditions and a semiconductor element to be used. As a rinse liquid to be used after use of the cleaning solution of the present invention, an organic solvent such as alcohol can be used, but it is sufficient to just rinse the semiconductor element with water.

The semiconductor element and the display element to which the cleaning solution of the present invention is applied include: a substrate material such as silicon, amorphous silicon, polysilicon and glass; an insulating material such as silicon oxide, silicon nitride, silicon carbide and derivatives thereof; a material such as cobalt, cobalt alloy, tungsten and titanium-tungsten; a compound semiconductor such as gallium-arsenic, gallium-phosphorus, indium-phosphorus, indium-gallium-arsenic and indium-aluminium-arsenic; an oxide semiconductor such as chromium oxide; etc.

As a general low-k film, a hydroxysilsesquioxane (HSQ)-based or methylsilsesquioxane (MSQ)-based OCD (trade name, manufactured by Tokyo Ohka Kogyo Co., Ltd.), a carbon-doped silicon oxide (SiOC)-based Black Diamond (trade name, manufactured by Applied Materials), Aurora (trade name, manufactured by ASM International), Coral (trade name, manufactured by Novellus Systems) and an inorganic Orion (trade name, manufactured by Trikon Technologies) can be used, but the low-k film is not limited thereto.

The semiconductor element to which the cleaning solution of the present invention is applied may include a barrier metal, a barrier insulating film and/or a hard mask.

As a general barrier metal, tantalum, tantalum nitride, titanium, titanium nitride, ruthenium, manganese, magnesium and oxides thereof can be used, but the barrier metal is not limited thereto.

As a general barrier insulating film, silicon nitride, silicon carbide and silicon carbonitride can be used, but the barrier insulating film is not limited thereto.

As a general hard mask, silicon, titanium, aluminium, tantalum, or an oxide, nitride or carbide of any of them can be used.

The hard mask included in the semiconductor element to which the cleaning solution of the present invention is applied is preferably a material that contains 10 atomic % or more of titanium. The atomic composition percentage of titanium is preferably 15 atomic % or more, more preferably 20 atomic % or more, even more preferably 25 atomic % or more, and particularly preferably 30 atomic % or more. Specific examples of the titanium-based material include titanium oxide, titanium nitride, titanium and titanium silicide, and preferred are titanium oxide, titanium nitride and titanium. It is possible to use two or more of these materials by lamination. The hard mask is not limited thereto.

In the present invention, the content of titanium can be examined by measuring the constituent ratio of titanium atoms in the targeted titanium-containing material according to the ion sputtering method of X-ray photoelectron spectroscopy (XPS). The vicinity of the surface of the titanium-containing material is oxidized, and therefore the constituent ratio of oxygen atoms therein may be higher than that in the inner part of the material. For this reason, the surface of the titanium-containing material is etched by ion sputtering until the constituent ratio of titanium atoms and oxygen atoms becomes constant, thereby measuring the constituent ratio of titanium atoms in the inner portion of the titanium-containing material exposed by ion sputtering. As a measurement apparatus, a fully automatic XPS analyzer K-Alpha (manufactured by Thermo Fisher Scientific Inc.) can be used.

The tungsten-containing material included in the semiconductor element to which the cleaning solution of the present invention is applied is a material containing 10 atomic % or more of tungsten, and the atomic composition percentage of tungsten is preferably 15 atomic % or more, more preferably 20 atomic % or more, even more preferably 25 atomic % or more, and particularly preferably 30 atomic % or more. Specific examples of the tungsten-containing material include tungsten oxide, tungsten nitride, tungsten and tungsten silicide, and preferred are tungsten oxide, tungsten nitride and tungsten. However, the tungsten-containing material is not limited thereto as long as it is a material containing 10 atomic % or more of tungsten.

In the present invention, the content of tungsten can be examined by measuring the constituent ratio of tungsten atoms in the targeted tungsten-containing material according to the ion sputtering method of XPS as described above. As a measurement apparatus, a fully automatic XPS analyzer K-Alpha (manufactured by Thermo Fisher Scientific Inc.) can be used.

Specific examples of the cobalt alloy-containing material included in the semiconductor element to which the cleaning solution of the present invention is applied include, but are not limited to, cobalt tungsten phosphorus, cobalt tungsten boron, cobalt chromium, cobalt chromium molybdenum, cobalt iron, cobalt niobium zirconium, cobalt aluminium, cobalt nickel, cobalt titanium, iron nickel cobalt and cobalt palladium.

EXAMPLES

Hereinafter, the present invention will be described in more detail based on Examples and Comparative Examples, but the present invention is not limited by the Examples.
SEM Observation
Observation was carried out using, as a measurement apparatus, a ultra-high resolution field-emission scanning electron microscope SU9000 manufactured by Hitachi High-Technologies Corporation (100,000×).
Judgment:
I. Removal state of dry etching residue
  E: The dry etching residue was completely removed.
  P: The dry etching residue was insufficiently removed.
  E is regarded as acceptable.
II. Damage to tungsten-containing material
  E: The tungsten-containing material showed no change compared to that prior to cleaning.
  G: There was a slightly rough portion on the surface of the tungsten-containing material.
  P: There was a big hole in the tungsten-containing material.
  E and G are regarded as acceptable.
III. Damage to cobalt
  E: The cobalt showed no change compared to that prior to cleaning.
  P: The cobalt showed change compared to that prior to cleaning.
  E is regarded as acceptable.
IV. Damage to low-k film
  E: The low-k film showed no change compared to that prior to cleaning.
  G: There was a slightly concave portion in the low-k film.
  P: There was a significantly concave portion in the low-k film.
  E and G are regarded as acceptable.
V. Damage to hard mask
  E: The hard mask showed no change compared to that prior to cleaning.
  P: The hard mask showed peeling or change in its shape.
  E is regarded as acceptable.

Examples 1-27

Semiconductor elements having layers shown in FIGS. 1 and 2 were used in the test. In order to remove a dry etching residue 1, the semiconductor element was immersed in a cleaning solution shown in Table 1 at a temperature and for a period of time shown in Table 2. After that, rinsing with ultrapure water and drying by dry nitrogen gas jet were carried out. The semiconductor element after cleaning was observed by SEM to judge the removal state of the dry etching residue 1 and damage to a tungsten-containing material 3, cobalt 4, a low-k film 2 and a hard mask 6. The hard mask 6 used in the test was titanium oxide, and 30 atomic % of titanium was contained. Further, the tungsten-containing material used in the test was tungsten oxide, and 40 atomic % of tungsten was contained.

The content of each of titanium and tungsten was measured according to the ion sputtering method of X-ray photoelectron spectroscopy (XPS) as described above. In each case, as a measurement apparatus, a fully automatic XPS analyzer K-Alpha (manufactured by Thermo Fisher Scientific Inc.) was used.

It is understood that in Examples 1-27 to which the cleaning solution of the present invention shown in Table 2 was applied, damage to the tungsten-containing material 3, cobalt 4, the low-k film 2 and the hard mask 6 was prevented while the dry etching residue 1 was completely removed. Moreover, in each of these Examples, a barrier metal 7 and a barrier insulating film 5 were not damaged.

Comparative Example 1 (Without Alkali Metal Compound)

The semiconductor element having layers shown in FIGS. 1 and 2 was cleaned with a cleaning solution containing 6% by mass of hydrogen peroxide, 1% by mass of 1,2,4-triazole, 0.001% by mass of barium nitrate and 92.999% by mass of water (Table 3, cleaning solution 2A). Cleaning conditions and evaluation results are shown in Table 4. It was impossible to remove the dry etching residue 1. Damage to the low-k film 2, the hard mask 6 and the tungsten-containing material 3 was successfully prevented, but cobalt 4 was damaged. Accordingly, it is understood that the cleaning solution 2A cannot be used for the purpose of suppressing damage to at least the low-k film and the material containing cobalt or a cobalt alloy and removing the dry etching residue on the surface of the product to be treated in the process for manufacturing the semiconductor element that is the target of the present invention.

Comparative Example 2 (Without Peroxide)

The semiconductor element having layers shown in FIGS. 1 and 2 was cleaned with a cleaning solution containing 0.6% by mass of potassium hydroxide, 1% by mass of 1,2,4-triazole, 0.001% by mass of barium nitrate and 98.399% by mass of water (Table 3, cleaning solution 2B). Cleaning conditions and evaluation results are shown in Table 4. It was impossible to remove the dry etching residue 1. Damage to the low-k film 2, the hard mask 6 and the tungsten-containing material 3 was successfully prevented, but cobalt 4 was damaged. Accordingly, it is understood that the cleaning solution 2B cannot be used for the purpose of suppressing damage to at least the low-k film and the material containing cobalt or a cobalt alloy and removing the dry etching residue on the surface of the product to be treated in the process for manufacturing the semiconductor element that is the target of the present invention.

Comparative Example 3 (Without Anticorrosive)

The semiconductor element having layers shown in FIGS. 1 and 2 was cleaned with a cleaning solution containing 0.6% by mass of potassium hydroxide, 6% by mass of hydrogen peroxide, 0.001% by mass of barium nitrate and 93.399% by mass of water (Table 3, cleaning solution 2C). Cleaning conditions and evaluation results are shown in Table 4. The dry etching residue 1 was successfully removed, and damage to the low-k film 2, the hard mask 6 and the tungsten-containing material 3 was successfully prevented. However, cobalt 4 was damaged. Accordingly, it is understood that the cleaning solution 2C cannot be used for the purpose of suppressing damage to at least the low-k film and the material containing cobalt or a cobalt alloy and removing the dry etching residue on the surface of the product to be treated in the process for manufacturing the semiconductor element that is the target of the present invention.

Comparative Example 4 (Without Alkaline Earth Metal Compound)

The semiconductor element having layers shown in FIGS. 1 and 2 was cleaned with a cleaning solution containing 0.6% by mass of potassium hydroxide, 6% by mass of hydrogen peroxide, 1% by mass of 1,2,4-triazole and 92.4% by mass of water (Table 3, cleaning solution 2D). Cleaning conditions and evaluation results are shown in Table 4. The dry etching residue 1 was successfully removed, and damage to the low-k film 2 and cobalt 4 was successfully prevented. However, the tungsten-containing material 3 and the hard mask 6 were damaged. Accordingly, it is understood that the cleaning solution 2D cannot be used for the purpose of suppressing damage to at least the low-k film and the material containing cobalt (or a cobalt alloy) and tungsten and removing the dry etching residue on the surface of the product to be treated in the process for manufacturing the semiconductor element that is the target of the present invention.

Comparative Example 5 (Without Alkaline Earth Metal Compound)

The semiconductor element having layers shown in FIGS. 1 and 2 was cleaned with a cleaning solution containing 0.01% by mass of potassium hydroxide, 0.01% by mass of hydrogen peroxide, 1% by mass of 1,2,4-triazole and 98.98% by mass of water (Table 3, cleaning solution 2E). Cleaning conditions and evaluation results are shown in Table 4. The dry etching residue 1 was successfully removed, and damage to the low-k film 2 and cobalt 4 was successfully prevented. However, the tungsten-containing material 3 and the hard mask 6 were damaged. Accordingly, it is understood that the cleaning solution 2E cannot be used for the purpose of suppressing damage to at least the low-k film and the material containing cobalt (or a cobalt alloy) and tungsten and removing the dry etching residue on the surface of the product to be treated in the process for manufacturing the semiconductor element that is the target of the present invention.

Comparative Example 6 (The Invention Described in Patent Documents 1 and 4)

The semiconductor element having layers shown in FIGS. 1 and 2 was cleaned with a cleaning solution containing 0.6% by mass of potassium hydroxide, 6% by mass of hydrogen peroxide, 0.1% by mass of benzotriazole, 0.01% by mass of polyethyleneimine (molecular weight: 1800) and 93.29% by mass of water (Table 3, cleaning solution 2F). Cleaning conditions and evaluation results are shown in Table 4. The dry etching residue 1 was successfully removed, and damage to the low-k film 2 was successfully prevented. However, the tungsten-containing material 3, cobalt 4 and the hard mask 6 were damaged. Accordingly, it is understood that the cleaning solution 2F cannot be used for the purpose of suppressing damage to at least the low-k film and the material containing cobalt (or a cobalt alloy) and tungsten and removing the dry etching residue on the surface of the product to be treated in the process for manufacturing the semiconductor element that is the target of the present invention.

Comparative Example 7 (The Invention Described in Patent Documents 2 and 4)

The semiconductor element having layers shown in FIGS. 1 and 2 was cleaned with a cleaning solution containing 0.6% by mass of potassium hydroxide, 6% by mass of hydrogen peroxide, 0.1% by mass of 5-amino-1H-tetrazole, 0.1% by mass of 1-hydroxybenzotriazole, 0.01% by mass of 4-amino-1,2,4-triazole and 93.19% by mass of water (Table 3, cleaning solution 2G). Cleaning conditions and evaluation results are shown in Table 4. The dry etching residue 1 was successfully removed, and damage to the low-k film 2 was successfully prevented. However, the tungsten-containing material 3, cobalt 4 and the hard mask 6 were damaged. Accordingly, it is understood that the cleaning solution 2G cannot be used for the purpose of suppressing damage to at least the low-k film and the material containing cobalt (or a cobalt alloy) and tungsten and removing the dry etching residue on the surface of the product to be treated in the process for manufacturing the semiconductor element that is the target of the present invention.

Comparative Example 8 (The Invention Described in Patent Documents 3 and 4)

The semiconductor element having layers shown in FIGS. 1 and 2 was cleaned with a cleaning solution containing 0.6% by mass of potassium hydroxide, 6% by mass of hydrogen peroxide, 0.102% by mass of benzotriazole, 0.125% by mass of copper sulfate pentahydrate, 0.01% by mass of 4-amino-1,2,4-triazole and 93.163% by mass of water (Table 3, cleaning solution 2H). Cleaning conditions and evaluation results are shown in Table 4. The dry etching residue 1 was successfully removed, and damage to the low-k film 2 was successfully prevented. However, the tungsten-containing material 3, cobalt 4 and the hard mask 6 were damaged. Accordingly, it is understood that the cleaning solution 2H cannot be used for the purpose of suppressing damage to at least the low-k film and the material containing cobalt (or a cobalt alloy) and tungsten and removing the dry etching residue on the surface of the product to be treated in the process for manufacturing the semiconductor element that is the target of the present invention.

Comparative Example 9 (The Invention Described in Patent Documents 1 and 5)

The semiconductor element having layers shown in FIGS. 1 and 2 was cleaned with a cleaning solution containing 0.6% by mass of potassium hydroxide, 6% by mass of hydrogen peroxide, 0.1% by mass of benzotriazole, 0.001% by mass of Ethoquad O/12 [oleylbis(2-hydroxyethyl)methylammonium-bis(trifluoromethanesulfonyl)imide] (manufactured by Lion Corporation) and 93.299% by mass of water (Table 3, cleaning solution 2I). Cleaning conditions and evaluation results are shown in Table 4. The dry etching residue 1 was successfully removed, and damage to the low-k film 2 was successfully prevented. However, the tungsten-containing material 3, cobalt 4 and the hard mask 6 were damaged. Accordingly, it is understood that the cleaning solution 2I cannot be used for the purpose of suppressing damage to at least the low-k film and the material containing cobalt (or a cobalt alloy) and tungsten and removing the dry etching residue on the surface of the product to be treated in the process for manufacturing the semiconductor element that is the target of the present invention.

Comparative Example 10 (The Invention Described in Patent Documents 2 and 5)

The semiconductor element having layers shown in FIGS. 1 and 2 was cleaned with a cleaning solution containing 0.6% by mass of potassium hydroxide, 6% by mass of hydrogen peroxide, 0.1% by mass of 5-amino-1H-tetrazole, 0.1% by mass of 1-hydroxybenzotriazole, 0.001% by mass of Ethoquad O/12 [oleylbis(2-hydroxyethyl)methylammonium-bis(trifluoromethanesulfonyl)imide] (manufactured by Lion Corporation) and 93.199% by mass of water (Table 3, cleaning solution 2J). Cleaning conditions and evaluation results are shown in Table 4. The dry etching residue 1 was successfully removed, and damage to the low-k film 2 was successfully prevented. However, the tungsten-containing material 3, cobalt 4 and the hard mask 6 were damaged. Accordingly, it is understood that the cleaning solution 2J cannot be used for the purpose of suppressing damage to at least the low-k film and the material containing cobalt (or a cobalt alloy) and tungsten and removing the dry etching residue on the surface of the product to be treated in the process for manufacturing the semiconductor element that is the target of the present invention.

Comparative Example 11 (The Invention Described in Patent Documents 3 and 5)

The semiconductor element having layers shown in FIGS. 1 and 2 was cleaned with a cleaning solution containing 0.6% by mass of potassium hydroxide, 6% by mass of hydrogen peroxide, 0.102% by mass of benzotriazole, 0.125% by mass of copper sulfate pentahydrate, 0.001% by mass of Ethoquad O/12 [oleylbis(2-hydroxyethyl)methylammonium-bis(trifluoromethanesulfonyl)imide] (manufactured by Lion Corporation) and 93.172% by mass of water (Table 3, cleaning solution 2K). Cleaning conditions and evaluation results are shown in Table 4. The dry etching residue 1 was successfully removed, and damage to the low-k film 2 was successfully prevented. However, the tungsten-containing material 3, cobalt 4 and the hard mask 6 were damaged. Accordingly, it is understood that the cleaning solution 2K cannot be used for the purpose of suppressing damage to at least the low-k film and the material containing cobalt (or a cobalt alloy) and tungsten and removing the dry etching residue on the surface of the product to be treated in the process for manufacturing the semiconductor element that is the target of the present invention.

Comparative Example 12 (The Invention Described in Patent Document 6)

The semiconductor element having layers shown in FIGS. 1 and 2 was cleaned with a cleaning solution containing 1.35% by mass of phosphoric acid, 1% by mass of hydrochloric acid, 5% by mass of tetramethylammonium hydroxide, 0.01% by mass of sodium lauryl diaminoethyl glycinate and 92.64% by mass of water (Table 3, cleaning solution 2L). Cleaning conditions and evaluation results are shown in Table 4. It was impossible to remove the dry etching residue 1. Damage to the low-k film 2, the hard mask 6 and the tungsten-containing material 3 was successfully prevented, but cobalt 4 was damaged. Accordingly, it is understood that the cleaning solution 2L cannot be used for the purpose of suppressing damage to at least the low-k film and the material containing cobalt or a cobalt alloy and removing the dry etching residue on the surface of the product to be treated in the process for manufacturing the semiconductor element that is the target of the present invention.

Comparative Example 13 (The Invention Described in Patent Document 7)

The semiconductor element having layers shown in FIGS. 1 and 2 was cleaned with a cleaning solution containing 12% by mass of tetramethylammonium hydroxide, 5% by mass of hydrogen peroxide, 2% by mass of potassium hydroxide, 35% by mass of triethanolamine and 46% by mass of water (Table 3, cleaning solution 2M). Cleaning conditions and evaluation results are shown in Table 4. It was impossible to remove the dry etching residue 1. Damage to the low-k film 2, the hard mask 6 and cobalt 4 was successfully prevented, but the tungsten-containing material 3 was damaged. Accordingly, it is understood that the cleaning solution 2M cannot be used for the purpose of suppressing damage to at least the low-k film and the material containing cobalt (or a cobalt alloy) and tungsten and removing the dry etching residue on the surface of the product to be treated in the process for manufacturing the semiconductor element that is the target of the present invention.

Comparative Example 14 (The Invention Described in Patent Document 8)

The semiconductor element having layers shown in FIGS. 1 and 2 was cleaned with a cleaning solution containing 2.6% by mass of potassium hydroxide, 0.9% by mass of hydrogen peroxide, 2% by mass of orthoperiodic acid, 0.03% by mass of ethylenediamine, 0.01% by mass of diethylenetriamine, 0.02% by mass of Surfynol 465 [a composition in which 65 mol % of ethylene oxide is added to 2,4,7,9-tetramethyl-5-decyne-4,7-diol] (manufactured by Air Products Japan Inc.), 0.02% by mass of cetyl trimethyl ammonium chloride, 10% by mass of N-methylpyrrolidone and 84.42% by mass of water (Table 3, cleaning solution 2N). Cleaning conditions and evaluation results are shown in Table 4. Damage to the low-k film 2, the hard mask 6 and cobalt 4 was successfully prevented, but it was impossible to remove the dry etching residue 1, and the tungsten-containing material 3 was damaged. Accordingly, it is understood that the cleaning solution 2N cannot be used for the purpose of suppressing damage to at least the low-k film and the material containing cobalt (or a cobalt alloy) and tungsten and removing the dry etching residue on the surface of the product to be treated in the process for manufacturing the semiconductor element that is the target of the present invention.

Comparative Example 15 (The Invention Described in Patent Document 9)

The semiconductor element having layers shown in FIGS. 1 and 2 was cleaned with a cleaning solution containing 0.1% by mass of benzotriazole, 0.1% by mass of 1,2,4-triazole, 5% by mass of ammonium fluoride, 1% by mass of boric acid and 93.8% by mass of water (Table 3, cleaning solution 2O). Cleaning conditions and evaluation results are shown in Table 4. Damage to the hard mask 6, the tungsten-containing material 3 and cobalt 4 was successfully prevented, but it was impossible to remove the dry etching residue 1, and the low-k film 2 was damaged. Accordingly, it is understood that the cleaning solution 2O cannot be used for the purpose of suppressing damage to at least the low-k film and the material containing cobalt (or a cobalt alloy) and tungsten and removing the dry etching residue on the surface of the product to be treated in the process for manufacturing the semiconductor element that is the target of the present invention.

Comparative Example 16

The semiconductor element having layers shown in FIGS. 1 and 2 was cleaned with a cleaning solution containing 1.2% by mass of potassium hydroxide, 16.5% by mass of tetramethylammonium hydroxide, 30% by mass of glycerin, 0.009% by mass of hydrogen peroxide and 52.291% by mass of water (Table 3, cleaning solution 2P). Cleaning conditions and evaluation results are shown in Table 4. Damage to the hard mask 6, the tungsten-containing material 3 and cobalt 4 was successfully prevented, but it was impossible to remove the dry etching residue 1, and the low-k film 2 was damaged. Accordingly, it is understood that the cleaning solution 2P cannot be used for the purpose of suppressing damage to at least the low-k film and the material containing cobalt (or a cobalt alloy) and tungsten and removing the dry etching residue on the surface of the product to be treated in the process for manufacturing the semiconductor element that is the target of the present invention.

TABLE 1

| Cleaning solution | Alkali metal compound | | Peroxide | | Anticorrosive | | Alkaline earth metal compound | | Water |
|---|---|---|---|---|---|---|---|---|---|
| | Type | Concentration % by mass | Type | Concentration % by mass | Type | Concentration % by mass | Type | Concentration % by mass | Concentration % by mass |
| 1A | KOH | 0.6 | Hydrogen peroxide | 6 | 1,2,4-TAZ | 1 | $Ba(NO_3)_2$ | 0.001 | 92.399 |
| 1B | KOH | 4.5 | Hydrogen peroxide | 6 | 1,2,4-TAZ | 1 | $Ba(NO_3)_2$ | 0.00075 | 88.49925 |
| 1C | KOH | 0.6 | Hydrogen peroxide | 6 | 1,2,4-TAZ | 1 | $Ba(NO_3)_2$ | 0.001 | 92.399 |
| 1D | KOH | 0.6 | Hydrogen peroxide | 6 | 1,2,4-TAZ | 1 | $Ba(NO_3)_2$ | 0.001 | 92.399 |
| 1E | KOH | 3 | Hydrogen peroxide | 30 | 1,2,4-TAZ | 1 | $Ba(NO_3)_2$ | 0.01 | 65.99 |
| 1F | KOH | 0.01 | Hydrogen peroxide | 0.01 | 1,2,4-TAZ | 1 | $Ba(NO_3)_2$ | 0.000001 | 98.979999 |
| 1G | KOH | 0.6 | Hydrogen peroxide | 6 | 1,2,4-TAZ | 5 | $Ba(NO_3)_2$ | 0.001 | 88.399 |
| 1H | KOH | 0.6 | Hydrogen peroxide | 6 | 1,2,4-TAZ | 0.01 | $Ba(NO_3)_2$ | 0.001 | 93.389 |
| 1I | KOH | 1.2 | Hydrogen peroxide | 0.5 | 1,2,4-TAZ | 0.5 | $Ba(NO_3)_2$ | 0.5 | 97.3 |
| 1J | $K_2CO_3$ | 0.75 | Hydrogen peroxide | 6 | 1,2,4-TAZ | 1 | $Ba(NO_3)_2$ | 0.001 | 92.249 |
| 1K | $KNO_3$ | 1.05 | Hydrogen peroxide | 6 | 1,2,4-TAZ | 1 | $Ba(NO_3)_2$ | 0.001 | 91.949 |
| 1L | $Li_2CO_3$ | 0.4 | Hydrogen peroxide | 6 | 1,2,4-TAZ | 1 | $Ba(NO_3)_2$ | 0.001 | 92.599 |
| 1M | LiOH | 0.45 | Hydrogen peroxide | 6 | 1,2,4-TAZ | 1 | $Ba(NO_3)_2$ | 0.001 | 92.549 |
| 1N | NaOH | 0.6 | Hydrogen peroxide | 6 | 1,2,4-TAZ | 1 | $Ba(NO_3)_2$ | 0.001 | 92.399 |
| 1O | $Cs_2CO_3$ | 1.75 | Hydrogen peroxide | 6 | 1,2,4-TAZ | 1 | $Ba(NO_3)_2$ | 0.001 | 91.249 |
| 1P | KOH | 1.2 | mCPBA | 0.5 | 1,2,4-TAZ | 0.5 | $Ba(NO_3)_2$ | 0.5 | 97.3 |
| 1Q | KOH | 1.2 | TBHP | 0.5 | 1,2,4-TAZ | 0.5 | $Ba(NO_3)_2$ | 0.5 | 97.3 |
| 1R | KOH | 0.6 | Hydrogen peroxide | 6 | 1,2-propanediamine | 0.5 | $Ba(NO_3)_2$ | 0.001 | 92.899 |

TABLE 1-continued

| Cleaning solution | Alkali metal compound Type | Concentration % by mass | Peroxide Type | Concentration % by mass | Anticorrosive Type | Concentration % by mass | Alkaline earth metal compound Type | Concentration % by mass | Water Concentration % by mass |
|---|---|---|---|---|---|---|---|---|---|
| 1S | KOH | 0.6 | Hydrogen peroxide | 6 | 1-amino-2-propanol | 0.5 | $Ba(NO_3)_2$ | 0.001 | 92.899 |
| 1T | KOH | 0.6 | Hydrogen peroxide | 6 | 1-methylimidazole | 0.5 | $Ba(NO_3)_2$ | 0.001 | 92.899 |
| 1U | KOH | 0.6 | Hydrogen peroxide | 6 | pyrazole | 0.5 | $Ba(NO_3)_2$ | 0.001 | 92.899 |
| 1V | KOH | 0.6 | Hydrogen peroxide | 6 | 5-methyl-1H-benzotriazole | 0.5 | $Ba(NO_3)_2$ | 0.001 | 92.899 |
| 1W | KOH | 0.6 | Hydrogen peroxide | 6 | 1,4-butanediamine | 0.5 | $Ba(NO_3)_2$ | 0.001 | 92.899 |
| 1X | KOH | 0.6 | Hydrogen peroxide | 6 | 2-aminoethanol | 0.5 | $Ba(NO_3)_2$ | 0.001 | 92.899 |
| 1AA | KOH | 0.6 | Hydrogen peroxide | 6 | 1,2,4-TAZ | 1 | $Ca(OH)_2$ | 0.0075 | 92.3925 |
| 1AB | KOH | 0.6 | Hydrogen peroxide | 6 | 1,2,4-TAZ | 1 | $SrCO_3$ | 0.001 | 92.399 |
| 1AC | KOH | 0.6 | Hydrogen peroxide | 6 | 1,2,4-TAZ | 1 | $BaSO_4$ | 0.0009 | 92.3991 |

KOH: potassium hydroxide
$K_2CO_3$: potassium carbonate
$KNO_3$: potassium nitrate
$Li_2CO_3$: lithium carbonate
LiOH: lithium hydroxide
NaOH: sodium hydroxide
$Cs_2CO_3$: cesium carbonate
mCPBA: m-chloroperoxybenzoic acid
TBHP: tert-butyl hydroperoxide
1,2,4-TAZ: 1,2,4-triazole
$Ba(NO_3)_2$: barium nitrate
$Ca(OH)_2$: calcium hydroxide
$SrCO_3$: strontium carbonate
$BaSO_4$: barium sulfate

TABLE 2

| Examples | Cleaning solution | Temperature ° C. | Immersion time min | Removal state I | Damage II | III | IV | V |
|---|---|---|---|---|---|---|---|---|
| 1 | 1A | 60 | 6 | E | E | E | E | E |
| 2 | 1B | 20 | 15 | E | G | E | E | E |
| 3 | 1C | 40 | 60 | E | E | E | E | E |
| 4 | 1D | 70 | 0.5 | E | E | E | E | E |
| 5 | 1E | 60 | 6 | E | G | E | E | E |
| 6 | 1F | 70 | 10 | E | G | E | G | E |
| 7 | 1G | 60 | 6 | E | G | E | E | E |
| 8 | 1H | 60 | 6 | E | E | E | E | E |
| 9 | 1I | 70 | 1 | E | E | E | E | E |
| 10 | 1J | 60 | 10 | E | E | E | E | E |
| 11 | 1K | 60 | 10 | E | E | E | E | E |
| 12 | 1L | 60 | 10 | E | E | E | E | E |
| 13 | 1M | 60 | 10 | E | G | E | E | E |
| 14 | 1N | 60 | 6 | E | G | E | E | E |
| 15 | 1O | 60 | 10 | E | G | E | E | E |
| 16 | 1P | 70 | 5 | E | E | E | E | E |
| 17 | 1Q | 70 | 5 | E | E | E | E | E |
| 18 | 1R | 60 | 6 | E | E | E | E | E |
| 19 | 1S | 60 | 6 | E | G | E | E | E |
| 20 | 1T | 60 | 6 | E | G | E | E | E |
| 21 | 1U | 60 | 6 | E | G | E | E | E |
| 22 | 1V | 60 | 6 | E | E | E | E | E |
| 23 | 1W | 60 | 6 | E | E | E | E | E |
| 24 | 1X | 60 | 6 | E | G | E | E | E |
| 25 | 1AA | 60 | 10 | E | G | E | E | E |

TABLE 2-continued

| Examples | Cleaning solution | Temperature °C. | Immersion time min | Removal state I | Damage II | III | IV | V |
|---|---|---|---|---|---|---|---|---|
| 26 | 1AB | 60 | 10 | E | G | E | E | E |
| 27 | 1AC | 60 | 10 | E | E | E | E | E |

Removal state I: removal state of dry etching residue 1
Damage II: damage to tungsten-containing material 3
Damage III: damage to cobalt 4
Damage IV: damage to low-k film 2
Damage V: damage to hard mask 6

TABLE 3

| Cleaning solution | Composition of cleaning solution (concentration: % by mass) |
|---|---|
| 2A | hydrogen peroxide: 6%, 1,2,4-triazole: 1%, barium nitrate: 0.001%, water: 92.999% |
| 2B | potassium hydroxide: 0.6%, 1,2,4-triazole: 1%, barium nitrate: 0.001%, water: 98.399% |
| 2C | potassium hydroxide: 0.6%, hydrogen peroxide: 6%, barium nitrate: 0.001%, water: 93.399% |
| 2D | potassium hydroxide: 0.6%, hydrogen peroxide: 6%, 1,2,4-triazole: 1%, water: 92.4% |
| 2E | potassium hydroxide: 0.01%, hydrogen peroxide: 0.01%, 1,2,4-triazole: 1%, water: 98.98% |
| 2F | potassium hydroxide: 0.6%, hydrogen peroxide: 6%, benzotriazole: 0.1%, polyethyleneimine (molecular weight: 1800): 0.01%, water: 93.29% |
| 2G | potassium hydroxide: 0.6%, hydrogen peroxide: 6%, 5-amino-1H-tetrazole: 0.1%, 1-hydroxybenzotriazole: 0.1%, 4-amino-1,2,4-triazole: 0.01%, water: 93.19% |
| 2H | potassium hydroxide: 0.6%, hydrogen peroxide: 6%, benzotriazole: 0.102%, copper sulfate pentahydrate: 0.125%, 4-amino-1,2,4-triazole: 0.01%, water: 93.163% |
| 2I | potassium hydroxide: 0.6%, hydrogen peroxide: 6%, benzotriazole: 0.1%, Ethoquad O/12: 0.001%, water: 93.299% |
| 2J | potassium hydroxide: 0.6%, hydrogen peroxide: 6%, 5-amino-1H-tetrazole: 0.1%, 1-hydroxybenzotriazole: 0.1%, Ethoquad O/12: 0.001%, water: 93.199% |
| 2K | potassium hydroxide: 0.6%, hydrogen peroxide: 6%, benzotriazole: 0.102%, copper sulfate pentahydrate: 0.125%, Ethoquad O/12: 0.001%, water: 93.172% |
| 2L | phosphoric acid: 1.35%, hydrochloric acid: 1%, tetramethylammonium hydroxide: 5%, sodium lauryl diaminoethyl glycinate: 0.01%, water: 92.64% |
| 2M | tetramethylammonium hydroxide: 12%, hydrogen peroxide: 5%, potassium hydroxide: 2%, triethanolamine: 35%, water: 46% |
| 2N | potassium hydroxide: 2.6%, hydrogen peroxide: 0.9%, orthoperiodic acid: 2%, ethylenediamine: 0.03%, diethylenetriamine: 0.01%, Surfynol 465: 0.02%, cetyl trimethyl ammonium chloride: 0.02%, N-methylpyrrolidone: 10%, water: 84.42% |
| 2O | benzotriazole: 0.1%, 1,2,4-triazole: 0.1%, ammonium fluoride: 5%, boric acid: 1% water: 93.8% |
| 2P | potassium hydroxide: 1.2%, tetramethylammonium hydroxide: 16.5%, glycerin: 30%, hydrogen peroxide: 0.009%, water: 52.291% |

Ethoquad O/12: [oleylbis(2-hydroxyethyl)methylammonium-bis(trifluoromethanesulfonyl)imide] (manufactured by Lion Corporation)
Surfynol 465: [a composition in which 65 mol % of ethylene oxide is added to 2,4,7,9-tetramethyl-5-decyne-4,7-diol] (manufactured by Air Products Japan Inc.)

TABLE 4

| Comparative Examples | Cleaning solution | Temperature °C. | Immersion time min | Removal state I | Damage II | III | IV | V |
|---|---|---|---|---|---|---|---|---|
| 1 | 2A | 60 | 6 | P | G | P | E | E |
| 2 | 2B | 60 | 6 | P | E | P | E | E |
| 3 | 2C | 60 | 6 | E | E | P | E | E |
| 4 | 2D | 60 | 6 | E | P | E | E | P |
| 5 | 2E | 70 | 10 | E | P | E | G | P |
| 6 | 2F | 60 | 6 | E | P | P | E | P |
| 7 | 2G | 60 | 6 | E | P | P | E | P |
| 8 | 2H | 60 | 6 | E | P | P | E | P |
| 9 | 2I | 60 | 6 | E | P | P | E | P |
| 10 | 2J | 60 | 6 | E | P | P | E | P |
| 11 | 2K | 60 | 6 | E | P | P | E | P |
| 12 | 2L | 60 | 6 | P | E | P | E | E |
| 13 | 2M | 50 | 0.5 | P | P | E | E | E |
| 14 | 2N | 50 | 0.33 | P | P | E | E | E |
| 15 | 2O | 50 | 6 | P | E | E | P | E |
| 16 | 2P | 50 | 2 | P | E | E | P | E |

Removal state I: removal state of dry etching residue 1
Damage II: damage to tungsten-containing material 3
Damage III: damage to cobalt 4
Damage IV: damage to low-k film 2
Damage V: damage to hard mask 6

INDUSTRIAL APPLICABILITY

When using the cleaning solution and the cleaning method of the present invention, in the process for manufacturing the semiconductor element, damage to at least the low-k film and (1) the material containing cobalt or a cobalt alloy or (2) the material containing cobalt or a cobalt alloy and tungsten can be suppressed, the dry etching residue on the surface of the product to be treated can be removed, the semiconductor element having high precision and high quality can be produced with a high yield, and therefore these are industrially useful.

EXPLANATIONS OF LETTERS OR NUMERALS

1: dry etching residue
2: low-k film
3: tungsten-containing material
4: cobalt
5: barrier insulating film
6: hard mask
7: barrier metal
8: copper

The invention claimed is:
1. A cleaning solution, comprising:
0.001 to 7% by mass of an alkali metal compound;
0.005 to 35% by mass of a peroxide;
0.005 to 10% by mass of an anticorrosive;
0.000001 to 1% by mass of an alkaline earth metal compound; and
water,
wherein the anticorrosive is at least one substance selected from the group consisting of 1,2-propanediamine, 1,3-propanediamine and 1,4-butanediamine.
2. The cleaning solution according to claim 1, wherein the alkali metal compound is at least one substance selected from the group consisting of lithium hydroxide, lithium sulfate, lithium carbonate, lithium hydrogen carbonate, lithium nitrate, lithium fluoride, lithium chloride, lithium bromide, lithium iodide, lithium acetate, sodium hydroxide, sodium sulfate, sodium carbonate, sodium hydrogen carbonate, sodium nitrate, sodium fluoride, sodium chloride, sodium bromide, sodium iodide, sodium acetate, potassium hydroxide, potassium sulfate, potassium carbonate, potassium hydrogen carbonate, potassium nitrate, potassium fluoride, potassium chloride, potassium bromide, potassium iodide, potassium acetate, cesium hydroxide, cesium sulfate, cesium carbonate, cesium hydrogen carbonate, cesium nitrate, cesium fluoride, cesium chloride, cesium bromide, cesium iodide and cesium acetate.
3. The cleaning solution according to claim 1, further comprising at least one substance selected from the group consisting of a calcium compound and a strontium compound.
4. The cleaning solution of claim 1, wherein the peroxide is at least one substance selected from the group consisting of hydrogen peroxide, m-chloroperoxybenzoic acid, and tert-butyl hydroperoxide.
5. The cleaning solution of claim 1, wherein the alkaline earth metal compound is barium nitrate.
6. The cleaning solution of claim 1, wherein the alkaline earth metal compound is a barium compound.
7. A method of removing a dry etching residue from a surface of a semiconductor element, the method comprising contacting the dry etching residue with the cleaning solution according to claim 1,
the semiconductor element being obtained by:
forming a hard mask pattern on a substrate comprising a low dielectric constant film, and
(1) a material comprising cobalt or a cobalt alloy or
(2) a material comprising cobalt or a cobalt alloy and tungsten; and then
dry etching the low dielectric constant film using the hard mask pattern as a mask.
8. A cleaning solution, comprising:
0.001 to 7% by mass of an alkali metal compound;
0.005 to 35% by mass of a peroxide;
0.005 to 10% by mass of an anticorrosive;
0.000001 to 1% by mass of an alkaline earth metal compound; and
water,
wherein the alkaline earth metal compound is barium sulfate.
9. The cleaning solution according to claim 8, wherein the alkali metal compound is at least one substance selected from the group consisting of lithium hydroxide, lithium sulfate, lithium carbonate, lithium hydrogen carbonate, lithium nitrate, lithium fluoride, lithium chloride, lithium bromide, lithium iodide, lithium acetate, sodium hydroxide, sodium sulfate, sodium carbonate, sodium hydrogen carbonate, sodium nitrate, sodium fluoride, sodium chloride, sodium bromide, sodium iodide, sodium acetate, potassium hydroxide, potassium sulfate, potassium carbonate, potassium hydrogen carbonate, potassium nitrate, potassium fluoride, potassium chloride, potassium bromide, potassium iodide, potassium acetate, cesium hydroxide, cesium sulfate, cesium carbonate, cesium hydrogen carbonate, cesium nitrate, cesium fluoride, cesium chloride, cesium bromide, cesium iodide and cesium acetate.
10. The cleaning solution according to claim 8, wherein the anticorrosive is at least one substance selected from the group consisting of 2-aminoethanol, 2-methylaminoethanol, 1-amino-2-propanol and 1-amino-3-propanol.
11. The cleaning solution according to claim 8, wherein the anticorrosive is at least one substance selected from the group consisting of pyrazole and 3,5-dimethylpyrazole.
12. The cleaning solution according to claim 8, further comprising at least one substance selected from the group consisting of a calcium compound and a strontium compound.
13. The cleaning solution of claim 8, wherein the anticorrosive is at least one substance selected from the group consisting of a diamine compound, an alkanolamine compound, a pyrazole compound, an imidazole compound and a triazole compound.
14. The cleaning solution of claim 13, wherein the imidazole compound is at least one substance selected from the group consisting of 1-methylimidazole, 1-vinylimidazole and 5-methylbenzimidazole.
15. The cleaning solution of claim 13, wherein the triazole compound is at least one substance selected from the group consisting of 1,2,4-triazole, 1,2,3-triazole and 5-methyl-1H-benzotriazole.
16. The cleaning solution of claim 8, wherein the peroxide is at least one substance selected from the group consisting of hydrogen peroxide, m-chloroperoxybenzoic acid, and tert-butyl hydroperoxide.
17. A method of removing a dry etching residue from a surface of a semiconductor element, the method comprising contacting the dry etching residue with the cleaning solution according to claim 8,
the semiconductor element being obtained by:
forming a hard mask pattern on a substrate comprising a low dielectric constant film, and
(1) a material comprising cobalt or a cobalt alloy or
(2) a material comprising cobalt or a cobalt alloy and tungsten; and then dry etching the low dielectric constant film using the hard mask pattern as a mask.

* * * * *